United States Patent
Shimizu

(10) Patent No.: US 10,663,951 B2
(45) Date of Patent: May 26, 2020

(54) RELAY DEVICE AND MANUFACTURING SYSTEM

(71) Applicant: FUJI CORPORATION, Chiryu-shi (JP)

(72) Inventor: Koji Shimizu, Kota-cho (JP)

(73) Assignee: FUJI CORPORATION, Chiryu-shi (JP)

( * ) Notice: Subject to any disclaimer, the term of this patent is extended or adjusted under 35 U.S.C. 154(b) by 107 days.

(21) Appl. No.: 15/735,383

(22) PCT Filed: Jun. 12, 2015

(86) PCT No.: PCT/JP2015/066982
§ 371 (c)(1),
(2) Date: Dec. 11, 2017

(87) PCT Pub. No.: WO2016/199288
PCT Pub. Date: Dec. 15, 2016

(65) Prior Publication Data
US 2018/0164786 A1      Jun. 14, 2018

(51) Int. Cl.
*H04L 29/08* (2006.01)
*G05B 19/4155* (2006.01)
(Continued)

(52) U.S. Cl.
CPC ..... *G05B 19/4155* (2013.01); *G05B 19/4185* (2013.01); *H01L 21/02* (2013.01);
(Continued)

(58) Field of Classification Search
None
See application file for complete search history.

(56) References Cited

U.S. PATENT DOCUMENTS

2005/0228529 A1   10/2005   Lev-Ami et al.
2006/0277289 A1   12/2006   Bayliss et al.
(Continued)

FOREIGN PATENT DOCUMENTS

| JP | 7-45489 A | 2/1995 |
| WO | 2007/049704 A1 | 5/2007 |

OTHER PUBLICATIONS

Office Action dated Oct. 12, 2018 in corresponding European Patent Application No. 15 894 973.5, citing document AX therein, 7 pages.
(Continued)

*Primary Examiner* — Cai Y Chen
(74) *Attorney, Agent, or Firm* — Oblon, McClelland, Maier & Neustadt, L.L.P.

(57) ABSTRACT

Provided is a relay device and manufacturing system that relays communication based on SECS/GEM protocol to a manufacturing system using a different communication protocol, and enables integrated management via a SECS/GEM host. Relay device performs protocol conversion between a SECS/GEM protocol and an original protocol that is a non-SECS/GEM protocol, and transfers data transmitted between user host and manufacturer host. Also, relay device performs transfer processing based on a port correspondence database that specifies local IP addresses of manufacturer host and the like and TCP protocol port numbers corresponding to these IP addresses.

20 Claims, 7 Drawing Sheets

(51) Int. Cl.
*H01L 21/02* (2006.01)
*G05B 19/418* (2006.01)
*H04L 29/06* (2006.01)
*H05K 13/04* (2006.01)

(52) U.S. Cl.
CPC .............. *H04L 67/12* (2013.01); *H04L 69/08* (2013.01); *H04L 69/18* (2013.01); *H05K 13/04* (2013.01); *G05B 2219/31174* (2013.01); *G05B 2219/31186* (2013.01); *G05B 2219/31202* (2013.01)

(56) References Cited

U.S. PATENT DOCUMENTS

| | | | |
|---|---|---|---|
| 2007/0008972 A1* | 1/2007 | Sifnatsch | H04L 29/12349 370/392 |
| 2007/0142950 A1* | 6/2007 | Okita | G03F 7/70525 700/108 |
| 2007/0150235 A1 | 6/2007 | Lev-Ami et al. | |
| 2014/0088749 A1 | 3/2014 | Ellis et al. | |
| 2015/0142162 A1 | 5/2015 | Bayliss et al. | |

OTHER PUBLICATIONS

P. Srisuresh et al., "Traditional IP Network Address Translator (Traditional NAT)", rfc3022.txt, Internet Engineering Task Force; Standard, Internet Society (ISOC) 4, XP015008805, Jan. 1, 2001, pp. 1-16 and cover page.

Extended European Search Report dated Apr. 20, 2018 in European Patent Application No. 15894973.5 citing documents AA-AE and AX therein, 12 pages.

Cheng, F-T. et al, "An object-based controller for equipment communications in semiconductor manufacturing", Robotics and Computer Integrated Manufacturing, vol. 18, No. 5-6, XP004391985, 2002, pp. 387-402.

International Search Report dated Sep. 8, 2015, in PCT/JP2015/066982 filed Jun. 12, 2015.

* cited by examiner

FIG. 4

Command correspondence database — DB2

| SEMS/GEM protocol stream and function | Corresponding control command of manufacturer-specified protocol | Transfer destination |
|---|---|---|
| ... | ... | ... |
| S7F4: Processing program check | Control data check (number of corresponding control command) | 192.168.1.10 (Manufacturer host) |
| S7F5: Processing program request | Control data request (number of corresponding control command) | 192.168.1.10 (Manufacturer host) |
| ... | ... | ... |

RELAY DEVICE AND MANUFACTURING SYSTEM

TECHNICAL FIELD

The present disclosure relates to a relay device configured to relay communications based on SECS/GEM protocol, and to a manufacturing system configured to perform communication using the relay device.

BACKGROUND ART

Conventionally, a commonly used communication protocol for semiconductor manufacturing systems is, for example, the SECS/GEM protocol certified by SEMI (Semiconductor Equipment and Materials International). SECS is an abbreviation of "Semiconductor Equipment Communication Standard". GEM is an abbreviation of Generic Model For Communications and Control of Manufacturing Equipment.

For example, there are semiconductor manufacturing systems in which semiconductor manufacturing devices such as a dicing device or a bonding device are connected to a host computer (hereinafter also referred to as "SECS/GEM host") that manages the semiconductor manufacturing devices via a communication network that uses SECS/GEM protocol (for example, refer to patent literature 1).

CITATION LIST

Patent Literature

Patent literature 1: JP-A-H7-45489

BRIEF SUMMARY

Problem to be Solved

By using the SECS/GEM protocol as a shared communication protocol within a manufacturing system, the SECS/GEM host is able to perform overall management of semiconductor manufacturing devices of different manufacturers. Also, recently, there is a demand to use one host computer to manage an integrated system of a semiconductor manufacturing system that uses the SECS/GEM protocol and a manufacturing system that uses a communication protocol not based on the SECS/GEM protocol (hereinafter also referred to as "non-SECS/GEM protocol"). A non-SECS/GEM protocol manufacturing is, for example, a board mounting manufacturing system that mounts electronic components on a circuit board.

However, for example, if you want to perform control of a board mounting device of a board mounting manufacturing system from a SECS/GEM host, the board mounting device must be provided with an interface that supports the SECS/GEM protocol. Also, even in this case, the SECS/GEM host is able to perform acquisition of required data from the board mounting device, but it cannot perform direct communication with the host computer that manages the board mounting manufacturing system. In this case, the SECS/GEM host, for example, cannot acquire control data managed by the host computer of the board mounting manufacturing system and the like. Therefore, there is room for improvement when integrating a SECS/GEM protocol manufacturing system and a non-SECS/GEM protocol manufacturing system.

The present disclosure takes account of the above circumstances, and an object thereof is to provide a relay device and manufacturing system that relays communication based on SECS/GEM protocol to a manufacturing system using a different communication protocol, and enables integrated management via a SECS/GEM host.

Means for Solving the Problem

A relay device of technology disclosed herein that solves the above problems is a relay device in a manufacturing system provided with a host computer configured to perform control via communication based on a SECS/GEM protocol, and multiple devices configured to perform communication via a non-SECS/GEM protocol that is not based on SECS/GEM, the relay device including: protocol converting processing configured for performing conversion between the SECS/GEM protocol and the non-SECS/GEM protocol when data is communicated between the host computer and each of the multiple devices; and transfer processing configured for setting multiple communication ports corresponding to each of the multiple devices, receiving transmission data sent from the host computer to each of the multiple devices via the communication port corresponding to the device that is a transmission destination for the transmission data, and transferring the data of after the protocol converting processing to a device in accordance with the transmission port.

The relay device performs transmission processing by performing protocol conversion between SECS/GEM protocol and non-SECS/GEM protocol. Also, the relay device sets a communication port corresponding to each of the multiple devices that perform communication using the non-SECS/GEM protocol, and sends data that specifies the communication port from the host computer. The relay device transfers the data of after protocol conversion processing to the device in accordance with the communication port. Thus, the host computer is able to, by performing communication using the specified communication port, manage the multiple devices that perform communication using non-SECS/GEM protocol via the relay device.

Also, the relay device, by switching communication ports in a single communication interface, is able to receive data corresponding to multiple devices.

Also, a relay device of technology disclosed herein may be configured to change the transfer destination in accordance with at least one of a function or a stream representing contents of the transmission data set based on standards of the SECS/GEM protocol set inside the transmission data sent from the host computer.

The relay device, for example, may change the transfer destination based on a number of a function or a number of a stream defined by the SECS/GEM protocol. Here, a stream, for example, may represent classifications of groups of related processing. A function specifies more detailed processing contents within a stream classification. Thus, a number of a stream or function will be different depending on the processing contents specified by the host computer. Also, SECS/GEM protocol is a protocol assumed to be a standard for communication of data between a SECS/GEM host and manufacturing devices that perform actual manufacturing such as a dicing device. On the other hand, for example, in a case of an integrated system of a SECS/GEM protocol manufacturing system and a non-SECS/GEM protocol manufacturing system, among data sent from the SECS/GEM host is data that should be sent to a management device of the non-SECS/GEM protocol manufacturing system rather than to a manufacturing device. For example, there are cases in which data not possessed by a manufacturing device is saved in a management device of the non-SECS/GEM protocol manufacturing system. Thus, by changing the transfer destination in accordance with a number of a stream or the like, it is possible to allocate data to an appropriate transfer destination in accordance with the processing contents. By this, the host computer can perform integrated management including a management device of the non-SECS/GEM protocol manufacturing system.

Also, the relay device of technology disclosed herein may be configured such that, the multiple devices include a work machine and a management device configured to manage control data for controlling the work machine, and in a case in which a number of at least one of the stream or the function is a number related to the control data, the management device is set as the transfer destination.

Here, a work machine is a mounting machine that manufactures a mounted board and performs communication using non-SECS/GEM protocol. Also, control data is, for example, data for controlling the mounting machine, a so-called recipe, which is data that specifies mounting positions of electronic components with respect to a circuit board and the like. The relay device, in a case in which a number of a stream or the like of data sent from the host computer is related to the control data, transfers the received data to the management device. For example, control data required for current manufacturing work only is saved in memory or the like of the mounting machine. On the other hand, old version control data, or the latest control data, and the like, may be saved in the management device. Therefore, processing related to the control data is desirably performed with respect to the management device, not with respect to the mounting machine. Here, with the relay device, when data of processing related to control data is received from the host computer, the data is transferred to the management device. Thus, the host computer, via the relay device, can perform referencing, acquisition, and the like of control data and the like saved in the management device not the mounting machine.

Further, a manufacturing system of technology disclosed herein that takes into account the above circumstances includes: the relay device; a host computer configured to perform control via communication based on a SECS/GEM protocol; multiple devices configured to perform communication via a non-SECS/GEM protocol that is not based on SECS/GEM, wherein the multiple devices include a work device, and a management device configured to manage control data for controlling the work machine, and the host computer, before starting work by controlling the work machine using the control data, performs control data acquisition process for acquiring control data from the management device.

With this manufacturing system, a user is able to check the contents of control data at the host computer that acquired the control data from the management device before starting work at a mounting machine. Also, the host computer can perform management by keeping a record related to the control data, for example, keeping a record of a history of changes to the contents of control data, a record of starting to use changed control data, or the like.

Also, a manufacturing system of technology disclosed herein may be configured such that the host computer, during the control data acquisition processing, in a case in which multiple versions corresponding to the control data to be acquired are saved in the management device, performs notifying processing for notifying a fact that the multiple versions are saved.

With this manufacturing system, the host computer, for example, in a case in which multiple versions corresponding to the control data to be acquired are saved, notifies that fact to a user. Here, for example, it is possible that both control data for which past results exist due to being used multiple times for control of a mounting machine, and latest control data that has recently been edited with the aim of improving work efficiency or the like, are saved in the management device. With respect to this, with this manufacturing system, a user is able to select control data for which past results exist or latest control data or the like in accordance with the contents of the report.

Advantageous Effects

According to technology disclosed herein, it is possible to relay communication based on SECS/GEM protocol to a manufacturing system that uses a different protocol, and to perform integrated management via a SECS/GEM host.

BRIEF DESCRIPTION OF DRAWINGS

FIG. 4 shows contents of data specified in a command correspondence database.

DETAILED DESCRIPTION

Figure 1:
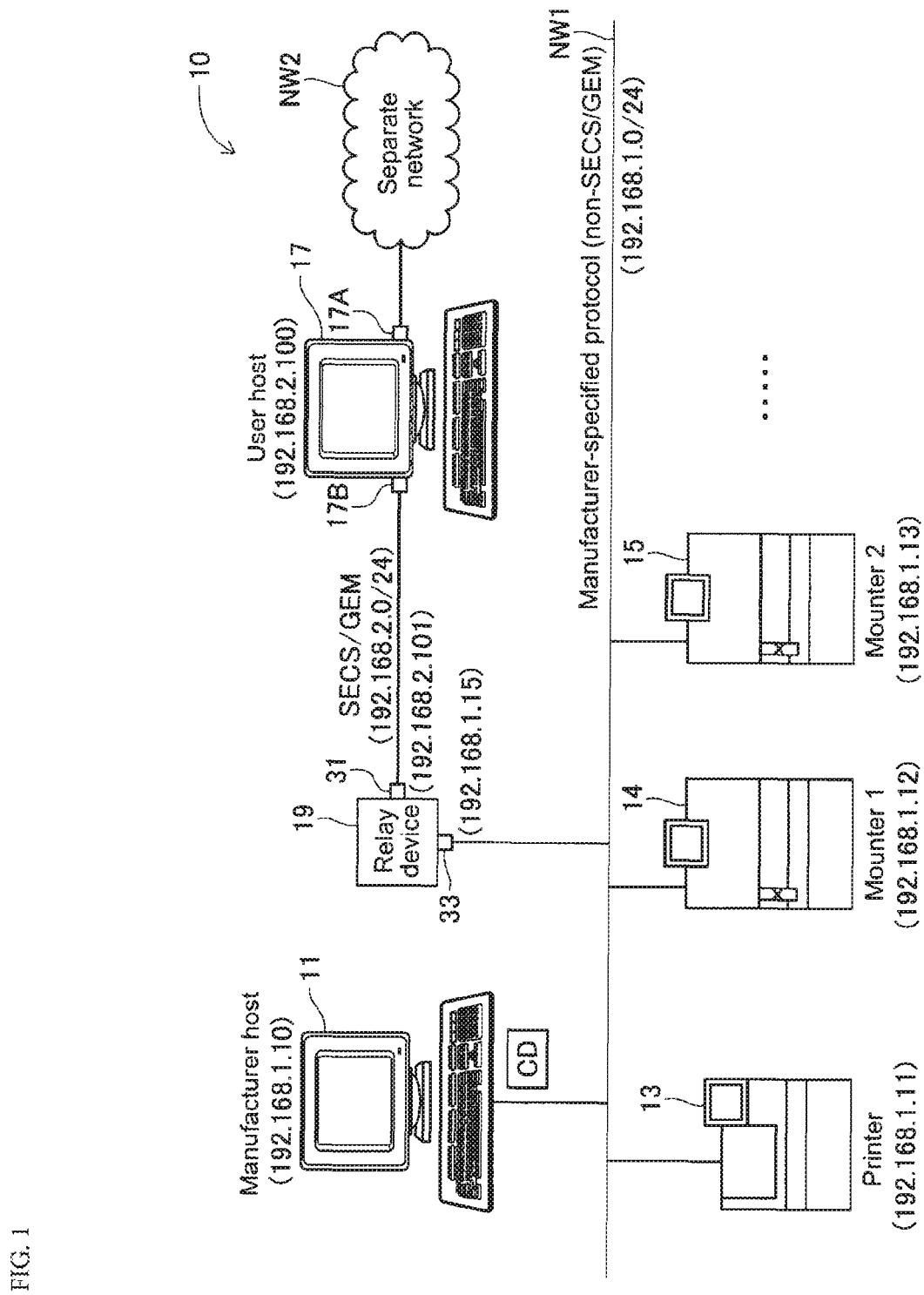
FIG. 1 shows the configuration of a network of a mounting board manufacturing system of an embodiment.

Hereinafter, the present disclosure is described with reference to the figures. FIG. 1 shows the network configuration of mounting board manufacturing (hereinafter referred to as "manufacturing system") 10 that is an embodiment of a manufacturing system of the present disclosure. As shown in FIG. 1, manufacturing system 10 is provided with manufacturer host 11, screen printer 13, multiple (only two shown in FIG. 1) mounting machines 14 and 15, user host 17, and relay device 19.

Manufacturer host 11 is a terminal for managing control data CD used to control operation of each of screen printer 13 and mounting machines 14 and 15. Screen printer (hereinafter also referred to as "printer") 13, for example, moves a squeegee across a mask using a squeegee moving device, so as to print solder paste through holes in the mask onto a circuit board such as a printed circuit that is conveyed along the production line. Also, mounting machines 14 and 15, for example, mount electronic components on the circuit board. Each mounting machine 14 and 15 performs component mounting work with respect to one circuit board by dividing up the work in accordance with the type of electronic components and so on. Note that, the configuration of devices that make up manufacturing system 10 shown in FIG. 1 (printer 13 and mounting machines 14 and 15) are simply an example, configurations are not limited to these. For example, manufacturing system 10 may be provided with an adhesive applying device for applying a temporary holding material used to attach components to the circuit board, a reflow oven for melting the solder on the circuit board so as to electrically connect the electronic components to the circuit board, or the like.

Manufacturer host 11 is a personal computer for performing management of manufacturing devices such as printer 13 and mounting machines 14 and 15 developed by the manufacturer. A user can manage the mounting board manufacturing line made up of printer 13 and the like using manufacturer host 11.

Also, manufacturer host 11, printer 13, and mounting machines 14 and 15 are connected to each other via local network NW1. Manufacturer host 11, printer 13, and mounting machines 14 and 15, for example, perform data communication with each other via local network NW1 using communication based on an original protocol defined by the manufacturer or the like. This original manufacturer communication protocol (hereinafter also referred to as "original protocol"), is a non-SECS/GEM protocol not based on the SECS/GEM protocol described later, for example, is a protocol by which data communication is possible using TCP/IP protocol.

Saved in manufacturer host 11 is, for example, data related to a circuit board on which work is to be performed (data such as the type of electronic component supplied from a component feeder provided on mounting machine 14, the shape of the component, the mounting position, and the like). For example, a user can operate manufacturer host 11 to create control data CD, a so-called recipe, used to control printer 13 and mounting machines 14 and 15. Printer 13 and so on perform work based on control data CD created at manufacturer host 11.

Also, user host 17 is connected to local network NW2 that is separate to local network NW1 via communication interface 17A. Connected to local network NW2 are semiconductor manufacturing devices (such as a dicing device and bonding device) capable of communication based on the SECS/GEM protocol. User host 17 controls multiple semiconductor manufacturing devices using communication messages conforming to the SECS/GEM protocol (data specifying the number of the stream or function, and the like). A semiconductor manufacturer device connected to local network NW2, for example, is upstream with respect to the manufacturing line described above that manufactures mounting boards. Also, electronic components manufactured by the semiconductor manufacturing device are mounted on the circuit board by mounting machine 14 in the downstream manufacturing line.

Also, user host 17 is connected to relay device 19 via communication interface 17B that is separate to communication interface 17A, and performs communication of data via communication that conforms to the SECS/GEM protocol. Relay device 19 is also connected to local network NW1, and performs communication of data with manufacturer host 11, printer 13, and the like via the original protocol which is a non-SECS/GEM protocol. Relay device 19 performs protocol conversion between the SECS/GEM protocol and non-SECS/GEM protocol and transfer of data for data communicated between user host 17 and manufacturer host 11 and the like.

Thus, user host 17 is connected to local network NW1 via relay device 19, making it possible to give instructions to printer 13 and the like to start manufacturing mounting boards, instructions to stop manufacturing, and so on. That is, user host 17 is able to perform integrated management of all the manufacturing devices connected to local network NW1 and local network NW2.

Figure 2:
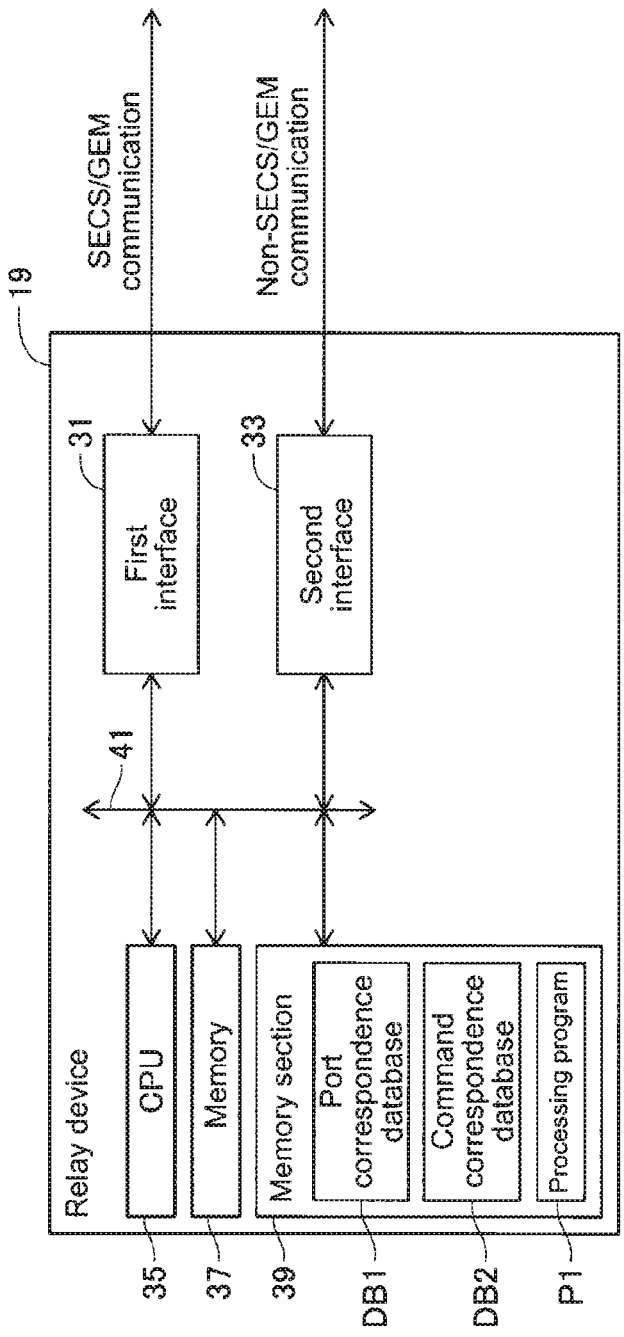
FIG. 2 is a block diagram showing the configuration of a relay device.

Described next is the detailed configuration of relay device 19. FIG. 2 shows a portion of the configuration of relay device 19 related to the present disclosure. As shown in FIG. 2, relay device 19 is provided with first interface 31, second interface 33, CPU 35, memory 37, and memory section 39, with these devices being connected to each other via internal bus 41.

Here, as shown in FIG. 1, for example, the network address and subnet mask of local network NW1 is "192.168.1.0/24". The IP address of manufacturer host 11 is set as, for example, "192.168.1.10". The IP address of printer 13 is set as, for example, "192.168.1.11". The IP address of mounting machine 14 is set as, for example, "192.168.1.12". The IP address of mounting machine 15 is set as, for example, "192.168.1.13". The IP address of second interface 33 is set as, for example, "192.168.1.15". The IP address of first interface 31 is set as, for example, "192.168.2.101". The IP address of communication interface 17 of user host 17 is set as, for example, "192.168.2.100".

First interface 31 and communication interface 17B are, for example, connected by a LAN cable and perform communication based on the SECS/GEM protocol. As shown in FIG. 1, the network address and subnet mask of the network is, for example, "192.168.2.0/24". Also, second interface 33 of relay device 19 is connected to local network NW1.

CPU 35 performs processing program P1 memorized on memory section 39 and performs processing of the above protocol conversion and the like. Memory 37 is, for example, RAM, and is working memory used while processing program P1 and the like is performed by CPU 35. Memory section 39 is, for example, ROM, and is a memory device provided with a hard disk or the like. As well as processing program P1, saved on memory section 39 are port correspondence database DB1 and command correspondence database DB2, which are described later.

User host 17, for example, during communication with relay device 19, performs communication based on the SECS/GEM protocol with first interface 31 IP address "192.168.2.101" with a TCP protocol port number specified.

Figure 3:
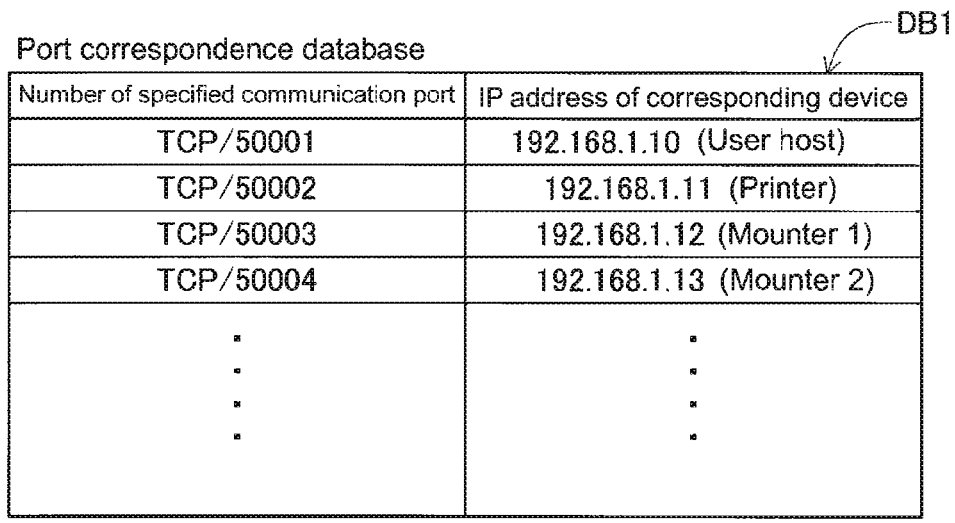
FIG. 3 shows contents of data specified in a port correspondence database.

FIG. 3 shows data set in port correspondence database DB1. As shown in FIG. 3, in port correspondence database DB1, TCP protocol port numbers specified by user host 17 are linked to IP addresses of devices that are transmission destinations for data when specified. TCP protocol port numbers, for example, are set as dynamic/private ports with port numbers from 49152 to 65535. However, port numbers used are not limited to these.

CPU 35, after performing processing program P1 and completing functionality of protocol conversion, for example, from user host 17 to first interface 31, receives data with TCP protocol port number "50001" specified. CPU 35 searches for a corresponding IP address from port correspondence database DB1 using the specified port number "50001" as a key. Manufacturer host 11 IP address "192.168.1.10" corresponds to port number "50001". Therefore, CPU 35, after performing protocol conversion with respect to the received data, sends the data to local network NW1 having changed the destination IP address to "192.168.1.10" (manufacturer host 11).

User host 17, for example, in application software that controls devices (printer 13 and so on) on local network NW1, similar to port correspondence database DB1 provided in relay device 19, sets data representing the relationship between transmission destination IP addresses and communication port numbers that should be specified corresponding to the transmission destinations. User host 17, when communication is performed to local network NW1, based on the corresponding relationship of data set in advance, specifies the TCP protocol port number, and sends data to relay device 19 (first interface 31).

Also, CPU 35, as processing for protocol conversion, for example, changes the contents, changes the order, splits, assembles, and so on, data received from user host 17. Specifically, for example, CPU 35 performs processing to change the number of a stream or function representing the contents of a communication message in SECS/GEM protocol into a number of a control command conforming to the original protocol.

Also, manufacturer host 11 receives data from user host 17 via relay device 19. Manufacturer host 11, for example, performs processing based on instructions from user host 17. Also, manufacturer host 11, for example, when a response is required, specifies second interface 33 IP address "192.168.1.15" which is the transmission source as the transmission destination address and sends the required data.

Also, when performing communication to user host 17 with a starting point of manufacturer host 11 or the like connected to local network NW1, manufacturer host 11 or the like sends data to second interface 33. For example, manufacturer host 11 sets second interface 33 IP address "192.168.1.15" as a default gateway. Manufacturer host 11 sends transmission data sent to network nodes other than local network NW1 ("192.168.1.0/24") (such as user host 17) to relay device 19. Relay device 19 performs protocol conversion on the data received from manufacturer host 11 and transfers the data. Thus, communication is performed between manufacturer host 11 and user host 17 via relay device 19.

Note that, user host 17, when performing communication to local network NW1, does not have to specify a TCP protocol port number. For example, user host 17 may be configured to set first interface 31 IP address "192.168.2.101" as the default gateway of communication interface 17B. In this case, user host 17, for example, sends communication sent to a network node other than the local network ("192.168.2.0/24"), for example, printer 13 ("192.168.1.11"), to relay device 19. Relay device 19 (CPU 35) may perform protocol conversion and transfer the data to the specified transmission destination IP address ("192.168.1.11").

Described next is transfer control in accordance with commands by relay device 19. FIG. 4 shows data set in command correspondence database DB2. As shown in FIG. 4, in command correspondence database DB2, numbers of streams or functions of SECS/GEM protocol specified by user host 17 are linked to numbers of control commands corresponding to the original protocol, and IP addresses of transfer destinations.

With SECS/GEM protocol, contents of transmission messages (control contents and so on) are specified by a number of a stream or function. A stream (S in FIG. 4), for example, represents classifications of groups of related processing. A function (F in FIG. 4) specifies more detailed processing contents within a stream classification. For example, "S7F5" in FIG. 4 represents a message requesting a process program.

Because devices on local network NW1 do not support SECS/GEM protocol, even if receiving data in which a number of these streams and functions is specified, cannot perform processing according to the message contents. Thus, CPU 35 of relay device 19 performs processing of protocol conversion using command correspondence database DB2 such that control commands of the original protocol corresponding to the control contents specified by the stream and function are specified. Also, relay device 19, in a case in which parameters required for performing processing in accordance with a stream or the like are set, performs conversion of these parameters.

CPU 35, after performing processing program P1, for example, receives "S7F5" specified data from user host 17. CPU 35 searches for a corresponding control command from command correspondence database DB2 using the specified stream and function number "S7F5" as a key. A number of a control command that requires control data CD in the original protocol corresponds to "S7F5". Therefore, CPU 35 converts the data format and contents of the received data.

Further, CPU 35 performs processing to change the transfer destination in accordance with the number of the specified stream or function. CPU 35, for example, receives data in which "S7F5" for requesting the process program (control data CD) saved in the memory or the like of printer 13 is specified from user host 17. CPU 35, because manufacturer host 11 is set as the transfer destination of "S7F5" in command correspondence database DB2, changes the transmission destination from printer 13 to manufacturer host 11. Also, CPU 35 changes data of the stream or the like of "S7F5" to a number of a control command of the original protocol that requests control data CD. Further, CPU 35 converts parameters and the like required for performing processing of the control command such that control data CD corresponding to printer 13 is requested from manufacturer host 11. By this, manufacturer host 11 performs receiving of data transferred by relay device 19 (control command and parameters) and processing of responding to relay device 19 with control data CD corresponding to printer 13. In this manner, relay device 19 converts data of the stream or the like and changes the transfer destination in accordance with the stream or the like.

Note that, mounting board manufacturing system 10 is an example of a manufacturing system. Manufacturer host 11 is an example of a management device. Printer 13 and mounting machines 14 and 15 are examples of work machines. User host 17 is an example of a host computer.

The embodiment described in detail above has the following effects.

Effect 1

Relay device 19 performs protocol conversion between a SECS/GEM protocol and an original protocol that is a non-SECS/GEM protocol, and transfers data transmitted between user host 17 and manufacturer host 11 and so on. Also, relay device 19 performs transfer processing (refer to FIG. 3) based on port correspondence database DB1 that specifies TCP protocol port numbers corresponding to each of devices such as manufacturer host 11. By this, relay device 19 is able to transfer data between a SECS/GEM protocol network and a non-SECS/GEM protocol network, local network NW1. Also, manufacturer host 17, by performing communication specifying the port number, is able to manage manufacturer host 11 that performs communication using the original protocol via relay device 19.

Further, relay device 19, by switching TCP protocol port numbers in a single communication interface (first interface 31), is able to receive data corresponding to multiple devices (manufacturer host 11 and printer 13) from user host 17.

Figure 6:
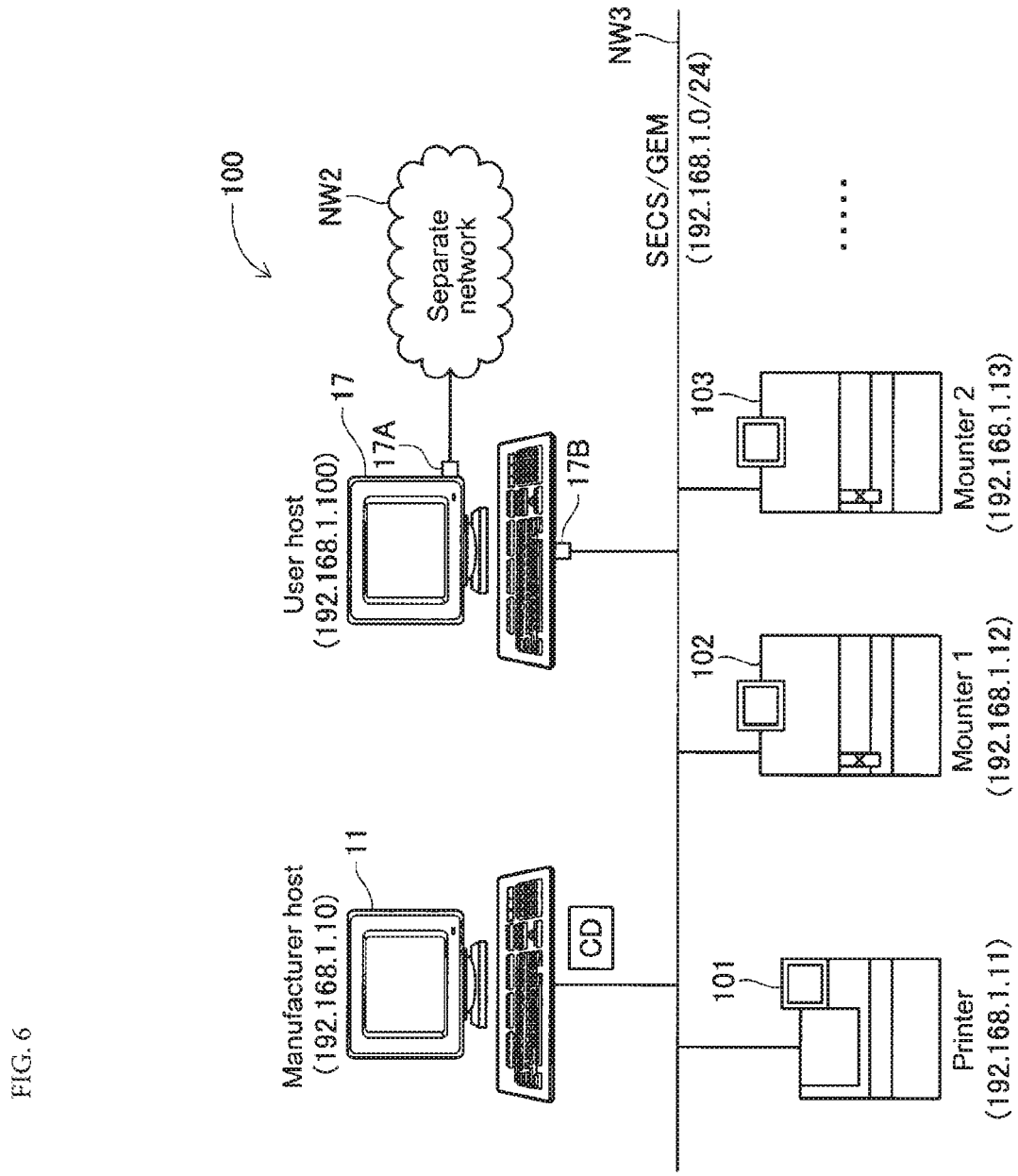
FIG. 6 shows the configuration of a network of a mounting board manufacturing system of an alternative embodiment.

Described here as a comparative example is the network configuration of manufacturing system 100 shown in FIG. 6. In the following description, where the configuration is the same as the above embodiment, the same reference numerals are assigned and descriptions thereof are omitted as appropriate. Manufacturing system 100 shown in FIG. 6 is different from manufacturing system 10 of the above embodiment in that relay device 19 is not provided. Also, manufacturer host 11, user host 17, printer 101, and mounting machines 102 and 103 are connected to each other via local network NW3. Further, printer 101, and mounting machines 102 and 103 support not only the original protocol for communication with manufacturer host 11, but also the SECS/GEM protocol for communication with user host 17. With such a configuration, for example, in a case of an update occurring to a program of a portion of user host 17 related to the SECS/GEM protocol, it is necessary to update the program of all the devices (printer 101 and mounting machines 102 and 103) that support the SECS/GEM protocol.

Compared to this, with manufacturing system 10 of the above embodiment, it is not necessary for printer 13 and the like to support the SECS/GEM protocol. Therefore, with manufacturing system 10, assuming that an update occurs to a program of a portion of user host 17 related to the SECS/GEM protocol, it is possible to support this by simply updating the program of relay device 19 as appropriate. Also, development of printer 13 and mounting machines 14 and 15 to support the SECS/GEM protocol is not required.

Effect 2

Relay device 19 uses command correspondence database DB2 saved in memory section 39 (refer to FIG. 4) to perform processing to change the transfer destination in accordance with the number of the stream or the like. Here, for example, development of control data CD is performed by operating manufacturer host 11. In other words, a user, for example, operates manufacturer host 11, and downloads the latest control data from a server of the manufacturer of printer 13 and the like. On the other hand, if you try and save multiple versions of control data CD on printer 13 or the like, the amount of memory used in printer 13 increases, which is linked to increased manufacturing costs for printer 13; thus, usually, only control data CD actually to be used is saved in printer 13 or the like. That is, there are cases in which multiple versions of control data CD not saved in the memory of printer 13 or the like that is actually to perform work are saved in manufacturer host 11.

With respect to this, when relay device 19 of the above embodiment, for example, receives data in which "S7F5" for requesting control data CD saved in the memory or the like of printer 13 is specified from user host 17, relay device 19 changes the transmission destination from printer 13 to user host 11 and performs transfer. By this, user host 17 is able to acquire control data CD not saved in printer 13 or the like from manufacturer host 11.

Effect 3

Further, user host 17, before mounting machine 102 starts work based on control data CD, is able to perform processing to acquire control data CD from manufacturer host 11 (an example of control data acquisition processing).

Figure 7:
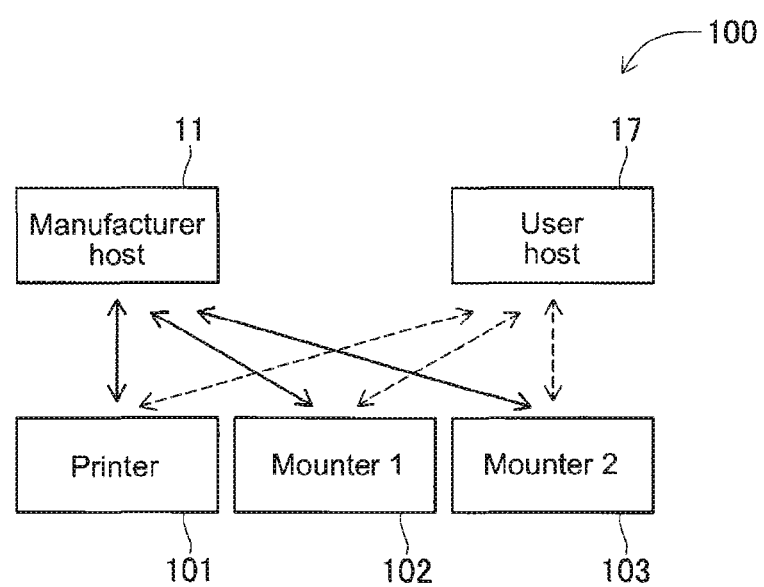
FIG. 7 is a conceptual diagram illustrating data transfer according to communication protocols with different standards in the alternative embodiment.

FIG. 7 schematically shows data transfer in manufacturing system 100 of the comparative example. The solid line arrows in FIG. 7 represent communication of data by the original protocol, which is non-SECS/GEM protocol. The dashed line arrows represent communication of data by the SECS/GEM protocol. Here, the SECS/GEM protocol is a protocol assumed to be a standard for communication of data between a computer used for management of a manufacturing system (SECS/GEM host) and manufacturing devices that perform actual manufacturing such as mounting machine 102. That is, with conventional SECS/GEM protocol thinking, it is assumed that data is communicated between the management computer (SECS/GEM host) and manufacturing devices that perform actual manufacturing such as printer 101. With manufacturing system 100 of the comparative example configured with a network based on these assumptions and thinking, because manufacturing host 11 and user host 17 support different communication protocols, they cannot perform direct communication with each other.

Therefore, user host 17, when wishing to acquire control data CD, must indirectly acquire data from printer 101 or the like that has been downloaded by printer 101 from manufacturer host 11. In other words, for user host 17 to acquire control data CD, printer 101 or the like has saved control data CD required to start manufacturing. As a result, when a manager of the manufacturing line uses user host 17 to check control data CD, if an operator of the manufacturing line directly operates printer 101 or the like, there is a worry manufacturing will be started based on the control data CD saved in that device. Therefore, there is a danger that manufacturing will be started using control data CD that contains a problem before the manager checks the control data CD, resulting in problems such as the manufacture of mounting boards with defective connections.

Figure 5:
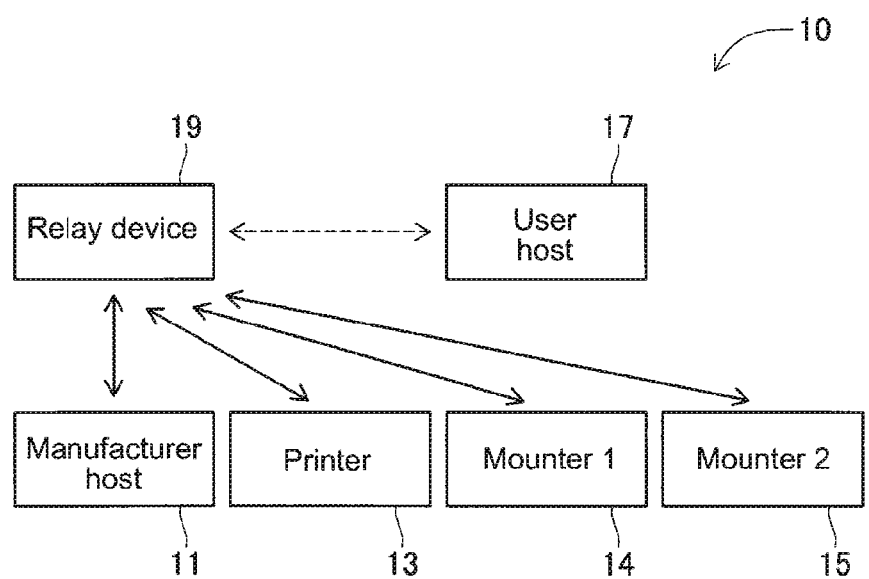
FIG. 5 is a conceptual diagram illustrating data transfer according to communication protocols with different standards.

On the other hand, FIG. 5 schematically shows data transfer in manufacturing system 10 of the above embodiment. The solid line arrows in FIG. 5 represent communication of data by the original protocol, which is non-SECS/GEM protocol. The dashed line arrow represents communication of data by the SECS/GEM protocol. With manufacturing system 10, user host 17 is able to communicate data with all devices on local network NW1 including manufacturer host 11 via relay device 19, and is able to manage all the devices. Therefore, for example, manufacturer host 11, if setting to not send control data CD from printer 13 or the like unless permission is granted from user host 17, is able to prevent the problems that occur in manufacturing system 100 of the above comparative example. Also, a user, before starting manufacturing of a mounting board by mounting machine 102, is able to transfer control data CD from manufacturer host 11 to user host 17, and is able to be check the contents of control data CD at user host 17. And, user host 17 is able to perform management by keeping a record related to the control data, for example, keeping a record of an update history of control data CD.

Effect 4

Also, user host 17, when acquiring control data CD, in a case in which multiple versions of control data CD are saved in manufacturer host 11, may perform processing to report that fact to a user (an example of reporting processing). For example, user host 17, in accordance with operations of a user, may send data that specifies a number of a stream or the like requesting a list of control data CD to relay device 19. Then, user host 17 may display the list of control data CD acquired from manufacturer host 11 on a display screen or the like.

Here, for example, it is possible that both control data for which past results exist due to being used multiple times for control of mounting machine 102, and latest control data CD that has recently been edited with the aim of improving work efficiency or the like, are saved in manufacturer host 11. With respect to this, if user host 17 is configured to display a list of control data CD, a user can refer to the display on user host 17, select the control data CD they wish to use, and thus perform manufacturing work having selected either control data CD for which past results exist or the latest control data CD.

Meanwhile, it goes without saying that the present disclosure is not limited to the above-mentioned embodiment and may be improved and modified in various ways without departing from the scope of the disclosure. For example, in the above embodiment, relay device 19 is configured as device on its own, but the configuration is not limited to this, for example, manufacturer host 11 and relay device 19 may be configured within the same device. Also, user host 17 may be provided with one of communication interface 17A and communication interface 17B, and may perform communication using the SECS/GEM protocol between both relay device 19 and local network NW2 with a single interface.

Also, relay device 19 does not have to perform processing to change the transfer destination in accordance with a number of a stream or the like. In this case, relay device 19 may be configured to not save command correspondence database DB2 on memory section 39. Also, relay device 19 may change the transfer destination in accordance with the number of a stream or the like for data other than control data CD as well. Further, relay device 19 receives data sent from user host 17 using a TCP protocol port number, but the communication port of the current disclosure is not limited to a TCP protocol port number, and may be a communication port conforming to another communication standard.

Also, user host 17 does not have to perform processing to acquire control data CD before starting work by printer 13 or the like. And, in a case in which there are multiple versions of control data CD acquired from manufacturer host 11, user host 17 does not have to perform processing to report that fact.

Further, in the above embodiment, a manufacturing system that mounts electronic components on a circuit board was given as an example of a system using non-SECS/GEM protocol, but the configuration is not limited to this, and it is possible to apply various types of manufacturing systems that perform communication using non-SECS/GEM protocol. For example, the present disclosure may be applied to a manufacturing system using a work robot that performs an assembly operation such as one for a secondary battery (a solar cell, a fuel cell, or the like).

REFERENCE SIGNS LIST

10: mounting board manufacturing system; 11: manufacturer host; 13: screen printer; 14, 15: mounting machine; 17: user host; 19: relay device; CD: control data

The invention claimed is:

1. A system comprising:
a host computer configured to perform control via communication based on a SECS/GEM protocol;
multiple devices configured to perform communication via a non-SECS/GEM protocol that is not based on SECS/GEM; and:
a relay device disposed between the host computer and the multiple devices, the relay device including circuitry configured to:
perform conversion between the SECS/GEM protocol and the non-SECS/GEM protocol when data is communicated between the host computer and at least one of the multiple devices;
set multiple communication ports, each corresponding to one of the multiple devices;
receive transmission data that is sent from the host computer to the at least one of the multiple devices and that specifies a communication port corresponding to the at least one of the multiple devices that is a transmission destination for the data; and
transfer the data to the at least one of the multiple devices that is the transmission destination including changing a destination address in accordance with the communication port.

2. The system according to claim 1, wherein the circuitry of the relay device is configured to change the transmission destination from the at least one of the multiple devices to another of the multiple devices in accordance with at least one of a function or a stream representing contents of the transmission data set based on standards of the SECS/GEM protocol and set inside the transmission data sent from the host computer.

3. The system according to claim 2, wherein
the multiple devices include a work machine and a management device configured to manage control data for controlling the work machine, and
in a case in which a number of at least one of the stream or the function is a number related to the control data, the circuitry of the relay device is configured to change the transmission destination from the at least one of the multiple devices to the management device.

4. The system according to claim 1, wherein
the multiple devices include
a work machine, and
a management device configured to manage control data for controlling the work machine, and
the host computer, before starting work by controlling the work machine using the control data, performs a control data acquisition process for acquiring control data from the management device.

5. The system according to claim 4, wherein the host computer, during the control data acquisition processing and in a case in which multiple versions corresponding to the control data to be acquired are saved in the management device, performs notifying processing for notifying a fact that the multiple versions are saved.

6. The system according to claim 1, wherein
the relay device further comprises:
a first interface configured to perform communication based on the SECS/GEM protocol and connected to the host computer; and
a second interface configured to perform communication based on the non-SECS/GEM protocol that is not based on SECS/GEM and connected to a first network, and
the multiple devices are all connected to the first network.

7. The system according to claim 6, wherein the host computer is connected to a second network different from the first network.

8. The system according to claim 1, wherein
the multiple devices include
a work machine, and
a management device configured to manage control data for controlling the work machine; and
the relay device further comprises
a first interface configured to perform communication based on the SECS/GEM protocol and connected to the host computer; and a second interface configured to perform communication based on the non-SECS/GEM protocol that is not based on SECS/GEM and connected to a first network; and the multiple devices are all connected to the first network.

9. The system according to claim 8, wherein the host computer is connected to a second network different from the first network.

10. The system according to claim 9, wherein the work machine includes a component mounting device.

11. The system according to claim 10, further comprising:
a semiconductor manufacturing device connected to the second network,
wherein the host computer controls the semiconductor manufacturing device via communication based on the SECS/GEM protocol.

12. The system according to claim 11, wherein the semiconductor manufacturing device is disposed upstream of the component mounting device in a manufacturing line.

13. The system according to claim 11, wherein
the management device was developed by a manufacturer of the component mounting device and is configured to manage the component mounting device, and
the host computer is configured to manage the component mounting device and the semiconductor manufacturing device.

14. The system according to claim 9, further comprising:
a manufacturing device connected to the second network, wherein the host computer controls the manufacturing device via communication based on the SECS/GEM protocol.

15. The system according to claim 14, wherein the manufacturing device is disposed upstream of the work machine in a manufacturing line.

16. The system according to claim 14, wherein
the management device is developed by a manufacturer of the work machine and is configured to manage the work machine, and
the host computer is configured to manage the work machine and the manufacturing device.

17. The system according to claim 1, wherein the circuitry of the relay device is configured to change a final destination for the data from the at least one of the multiple devices to another of the multiple devices based upon contents of the transmission data.

18. The system according to claim 3, wherein, in a case in which the number of the at least one of the stream or the function is not the number related to the control data, the circuitry of the relay device is configured to maintain the transmission destination as the at least one of the multiple devices.

19. The system according to claim 1, wherein the communication port specified by the transmission data received by the circuitry of the relay device is a TCP protocol port number.

20. The system according to claim 7, wherein the second network is completely isolated from the first network.

* * * * *